(12) United States Patent
Srinivasan et al.

(10) Patent No.: US 7,926,900 B2
(45) Date of Patent: Apr. 19, 2011

(54) METHOD OF PRINTING WITH HIGH SPOT PLACEMENT ACCURACY

(75) Inventors: Uma Srinivasan, Mountain View, CA (US); John Stuart Fitch, Los Altos, CA (US); Steven E. Ready, Mountain View, CA (US)

(73) Assignee: Palo Alto Research Center Incorporated, Palo Alto, CA (US)

(*) Notice: Subject to any disclaimer, the term of this patent is extended or adjusted under 35 U.S.C. 154(b) by 693 days.

(21) Appl. No.: 11/644,129

(22) Filed: Dec. 22, 2006

(65) Prior Publication Data

US 2008/0150995 A1 Jun. 26, 2008

(51) Int. Cl.
*B41J 29/393* (2006.01)
(52) U.S. Cl. .................... 347/19; 347/5; 347/14
(58) Field of Classification Search .......... 347/3, 9, 347/14–15, 19, 5, 12
See application file for complete search history.

(56) References Cited

U.S. PATENT DOCUMENTS

| | | | |
|---|---|---|---|
| 5,932,012 A | 8/1999 | Ishida et al. | |
| 6,247,787 B1 | 6/2001 | Giere et al. | |
| 6,890,050 B2 | 5/2005 | Ready et al. | |
| 6,972,261 B2 | 12/2005 | Wong et al. | |
| 2001/0038397 A1* | 11/2001 | Kobayashi et al. | 347/14 |
| 2004/0231594 A1 | 11/2004 | Edwards et al. | |
| 2005/0083364 A1 | 4/2005 | Billow | |
| 2006/0158478 A1 | 7/2006 | Howarth et al. | |

OTHER PUBLICATIONS

Gao, Fuquan, Ain A. Sonin, Precise Deposition of Molten Microdrops: The Physics of Digital Microfabrication, Proceedings: Mathematical and Physical Sciences, vol. 444, No. 1922 (Mar. 8, 1994), The Royal Society.
Schiaffino, Stefano and Ain A. Sonin, Molten Droplet Deposition and Soldification at Low Weber Numbers, Phys. Fluids p. 3172, Nov. 1997 American Institute of Physics.
Schiaffino, Stefano and Ain A. Sonin, Formation and Stability of Liquid and Molten Beads on a Solid Surface, J. Fluid Mech. (1997) vol. 343, pp. 95-110, 1997 Cambridge University Press.
European Search Report, Apr. 14, 2008.

* cited by examiner

*Primary Examiner* — Lam S Nguyen
(74) *Attorney, Agent, or Firm* — Fay Sharpe LLP

(57) ABSTRACT

A method of printing spots with high spot placement accuracy using print heads with random/unevenly spaced ejector locations and coarse alignment of the multiple print heads. This is performed by accurately determining the spot positions from all the print heads using a vision system and printing at high addressability. The spot placement accuracy will be determined by the addressability as long as the ejected drop position is reproducible and other system errors are negligible.

25 Claims, 12 Drawing Sheets

METHOD OF PRINTING WITH HIGH SPOT PLACEMENT ACCURACY

BACKGROUND

A printed circuit board, or PCB, is a self-contained module of interconnected electronic components found in devices ranging from common beepers, or pagers, and radios to sophisticated radar and computer systems. The circuits are generally formed by a thin layer of conducting material deposited, or "printed," on the surface of an insulating board known as the substrate. Individual electronic components are placed on the surface of the substrate and soldered to the interconnecting circuits. Contact fingers along one or more edges of the substrate act as connectors to other PCBs or to external electrical devices such as on-off switches. A printed circuit board may have circuits that perform a single function, such as a signal amplifier, or multiple functions.

Two other types of circuit assemblies are related to the printed circuit board. An integrated circuit, sometimes called an IC or microchip, performs similar functions to a printed circuit board except the IC contains many more circuits and components that are electrochemically "grown" in place on the surface of a very small chip of silicon. A hybrid circuit, as the name implies, looks like a printed circuit board, but contains some components that are grown onto the surface of the substrate rather than being placed on the surface and soldered.

The printing of circuits is an emerging technology that attempts to reduce the costs associated with circuit production by replacing expensive lithographic processes with simple printing operations. By printing a circuit pattern directly on a substrate rather than using the delicate and time-consuming lithography processes used in conventional circuit manufacturing, a circuit printing system can significantly reduce production costs. The printed circuit pattern can either comprise actual circuit features (i.e., elements that will be incorporated into the final circuit, such as the gates and source and drain regions of thin film transistors, signal lines, opto-electronic device components, etc.) or it can be a mask for subsequent semiconductor processing (e.g., etch, implant, etc.).

A printed wax pattern may be used as copper etch mask for creating PCBs. Laser direct imaging (LDI) is a maskless lithography method that is currently being used for this purpose. It uses a laser to write the raster image of the pattern directly on the photoresist. In order for it to be to be cost-effective, it is necessary to have special high speed resists. Also, there is no suitable method for soldermask patterning using laser direct imaging, which is the final crucial lithography step in PCB manufacturing.

Typically, circuit printing involves depositing a print solution (generally an organic material) by raster bitmap along a single axis (the "print travel axis") across a solid substrate. Print heads, and in particular, the arrangements of the ejectors incorporated in those print heads, are optimized for printing along a print travel axis. Printing of a pattern takes place in a raster fashion, with the print head making "printing passes" across the substrate as the ejector(s) in the print head dispense individual droplets of print solution onto the substrate. At the end of each printing pass, the print head position relative to the substrate is often adjusted perpendicular to the print travel axis before beginning a new printing pass. The print head continues making printing passes across the substrate in this manner until the circuit pattern has been fully printed.

Once dispensed from the ejector(s) of the print head, print solution droplets attach themselves to the substrate through a wetting action and proceed to solidify in place. The size and profile of the deposited material is guided by competing processes of wetting and solidification. In the case of printing phase-change materials, solidification occurs when the printed spot loses its thermal energy to the substrate and reverts to a solid form. In another case, colloidal suspensions such as organic polymers and suspensions of electronic material in a solvent or carrier are printed and wet to the substrate leaving a printed feature. The thermal conditions and material properties of the print solution and substrate, along with the ambient atmospheric conditions, determine the specific rate at which the deposited print solution transforms from a liquid to a solid.

Spot placement accuracy is extremely important for semiconductor fabrication processes. Failure to have good spot placement accuracy can result in patterning defects, which can reduce the yield and lead to inconsistent device performance.

In order to have high spot placement accuracy, it is highly desirable to have print heads that have evenly spaced ejectors with the desired pitch or multiples of the desired pitch. It is therefore common to have print heads with one row of evenly spaced ejectors. This row is then rotated relative to the process motion direction such that the spacing between ejectors may be adjusted. However, some of the commercial print heads available in the market have high density of unevenly spaced ejectors. While the high density of ejectors is a desirable feature, the unevenly spaced ejectors are not. Presently, the print heads with unevenly spaced ejectors are used in certain systems to produce high spot placement accuracy by selecting ejectors that do not have significant offset from the desired location and printing at low addressability. This limits the number of ejectors that qualify for printing and therefore reduces the advantage of having high density of ejectors in the print head.

Some of the print heads have offsets in the ejector locations, which may be deliberately introduced or caused by other production limitations. For example, a print head with an ejector pitch of 169.32 μm (corresponding to 150 dpi) will give ideal printed spot positions at multiples of 150 DPI (600 DPI, 1200 DPI, etc.). However, if some of the ejectors are not in the ideal location of the 169.32 μm but have an offset, the printed spots will have a spot placement accuracy limited by the offset when printed at 150 DPI.

Thus, there is a need for a method of printing with high spot placement accuracy using print heads with random/unevenly spaced ejector locations and coarse alignment of the multiple print heads.

INCORPORATION BY REFERENCE

The following references, the disclosures of which are incorporated herein in their entireties by reference, are mentioned:

U.S. Pat. No. 6,972,261, issued Dec. 6, 2005 to Wong et al., entitled "METHOD FOR FABRICATING FINE FEATURES BY JET-PRINTING AND SURFACE TREATMENT," describes a method of forming smaller features by jet-printing with materials from aqueous or non-aqueous organic solutions.

U.S. Pat. No. 6,890,050, issued May 10, 2005 to Ready et al., entitled "METHOD FOR THE PRINTING OF HOMOGENEOUS ELECTRONIC MATERIAL WITH A MULTI-EJECTOR PRINT HEAD," describes a system and method for accurately printing IC patterns and allows the printed features to be optimized for spot placement, edge profile and electrical continuity.

BRIEF DESCRIPTION

Disclosed herein is a method of printing spots with high spot placement accuracy using print heads with random/unevenly spaced ejector locations and coarse alignment of the multiple print heads. This is performed by accurately determining the spot positions from all the print heads using a vision system and printing at high addressability. The spot placement accuracy will be determined by the addressability as long as the spot position is reproducible and other system errors are negligible.

In accordance with an aspect of the exemplary embodiment, there is provided a method of printing spots on a substrate with high spot placement accuracy. The method comprises: setting up a plurality of components of a printing system, where the plurality of components includes a camera and one or more print heads with one or, more ejectors on each print head; ejecting at least one drop from all of the ejectors of at least one print head; using the camera to measure the positions of the printed spots from the print heads; and storing the measured spot positions in a common coordinate system as initial virtual positions describing at least one virtual print head.

In accordance with another aspect of the exemplary embodiment, there is provided a storage medium storing a set of program instructions executable on a data processing device and usable to print spots on a substrate with high spot placement accuracy. The set of program instructions comprises: instructions for setting up a plurality of components of a printing system, where the plurality of components includes a camera and one or print heads with one or more ejectors on each print head; instructions for ejecting one drop from all of the ejectors of at least one print head; instructions for using the camera to measure the positions of the printed spots from the print heads; and instructions for storing the measured spot positions in a common coordinate system as initial virtual positions describing at least one virtual print head.

DETAILED DESCRIPTION

Figure 1:
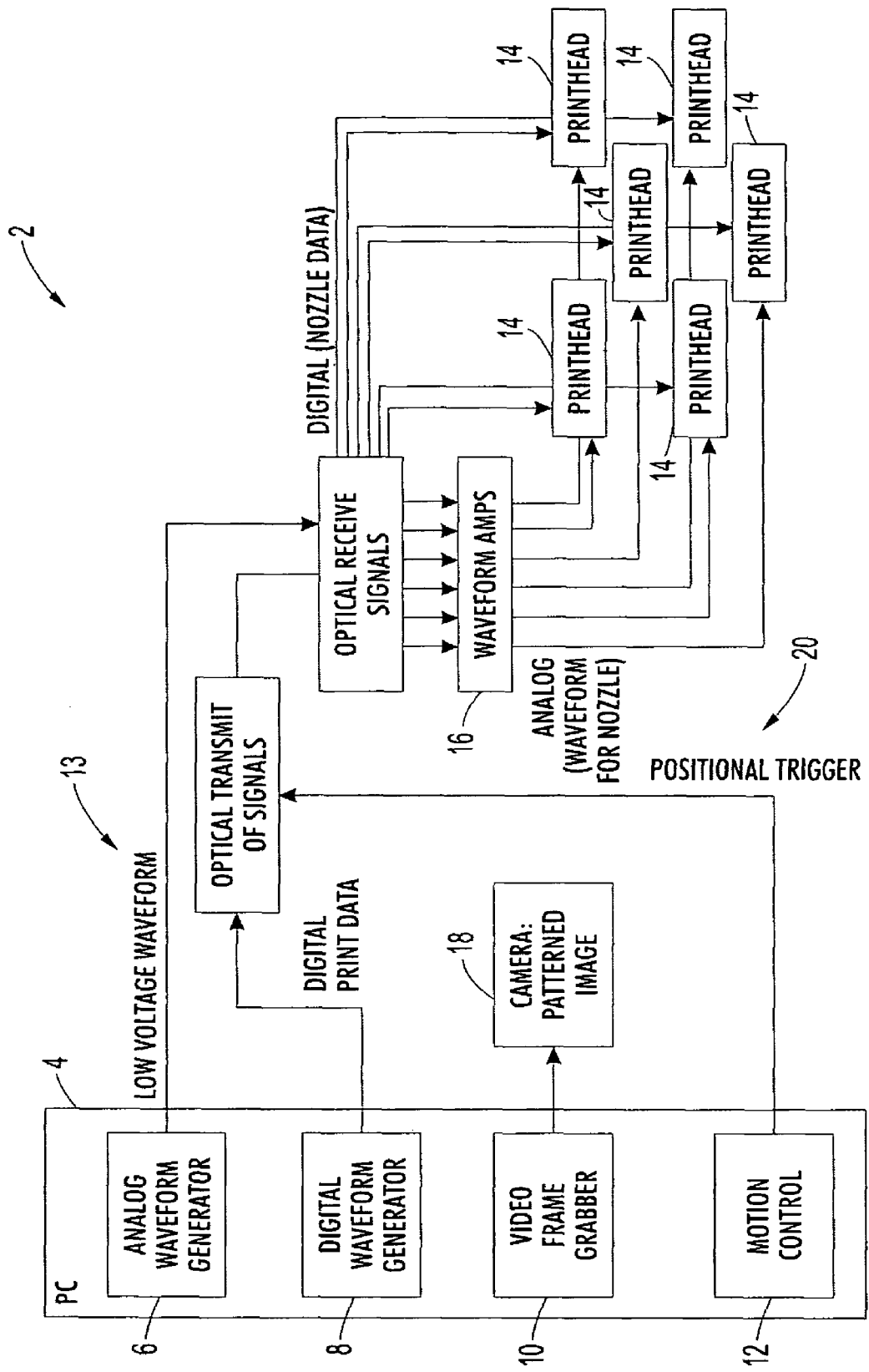
FIG. 1 is a schematic diagram of the system architecture.

Some portions of the detailed description that follows are presented in terms of algorithms and symbolic representations of operations on data bits performed by conventional computer components, including a central processing unit (CPU), memory storage devices for the CPU, and connected display devices. These algorithmic descriptions and representations are the means used by those skilled in the data processing arts to most effectively convey the substance of their work to others skilled in the art. An algorithm is generally perceived as a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be understood, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The exemplary embodiment also relates to an apparatus for performing the operations discussed herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general-purpose systems may be used with programs in accordance with the teachings herein, or it may prove convenient to construct more specialized apparatus to perform the methods described herein. The structure for a variety of these systems will be apparent from the description below. In addition, the exemplary embodiment is not described with reference to any particular programming language. It will be appreciated that a variety of programming languages may be used to implement the teachings of the exemplary embodiment as described herein.

A machine-readable medium includes any mechanism for storing or transmitting information in a form readable by a machine (e.g., a computer). For instance, a machine-readable medium includes read only memory ("ROM"); random access memory ("RAM"); magnetic disk storage media; optical storage media; flash memory devices; and electrical, optical, acoustical or other form of propagated signals (e.g., carrier waves, infrared signals, digital signals, etc.), just to mention a few examples.

In describing the exemplary embodiments, the term "data" refers herein to physical signals that indicate or include information. In this case, "image," as a pattern of physical light or a collection of data representing the physical light, may include characters, words, and text as well as other features such as graphics and circuit layouts. An operation performs "image processing" when it operates on an item of data that relates to a part or all of an image.

An image may be a high addressability image if even only a single pixel of the image is formatted, sampled or produced in one of many known scenarios, all of which may apply to various embodiments. A high addressability pixel can be a pixel comprising a plurality of high addressability pixel events, where, for example, each of the high addressability pixel events corresponds to a specific spatial placement of the writing spot with respect to the pixel- and has a value that represents a property of the writing spot at that specific spatial placement. In binary high addressability pixels, for example, each high addressability pixel event is a single bit indicating whether the writing spot is "on" or "off" at the corresponding spatial placement. In general, high addressability, as used above, refers to a pixel grid where the spatial sampling of the grid is higher in one dimension than in the other dimension.

High addressability also commonly refers to an imaging method where the imaging device can position the writing spot with precision finer than the size of the writing spot. For instance, a typical high addressability system may operate with a 40 µm writing spot, an addressability of 600 DPI in the direction perpendicular to the raster lines, and an addressability of 4800 DPI in the direction of the raster lines.

High addressability also refers to writing an image with a higher sampling resolution than is input to the writing system. Similarly, high addressability also refers to a pixel sampling resolution that is higher than the input resolution in at least one dimension. For example, an input resolution of 300 DPI may be converted to 600 DPI and that resolution conversion is referred to as high addressability.

Systems that write high addressability images typically regulate a laser or similar writing device using clock modulation, amplitude modulation, pulse width modulation, pulse width position modulation or equivalent procedures. Imaging devices other than laser scanners can also employ high addressability. For instance, ink jet devices can have drop ejection rates that yield spot placements at high addressability and LED image bars can clock the LED "on" events at rates that are high relative to the spot size and diode spacing.

One or more of the features of the exemplary embodiments described herein may be applied to any digital image, including, for example, a high addressability image.

Furthermore, it is well known for most systems that digitally reproduce images use mechanical systems to properly align the document as it is transported to the scanning area. While mechanical systems and methods are useful, they cannot typically place the document in perfect alignment position on the scanning surface before it is captured by the scanner. As such, electronic systems and methods are employed to apply the fine tuning that is required to accurately align the image.

For example, "skew" may be introduced when an input document or image becomes rotated relative to the image sensor before it is captured. Skew correction is a well known imaging process that eliminates skew by determining the magnitude and direction of the document rotation relative to a document edge and applying a corresponding counter rotation to the image data.

Turning now to the figures, FIG. 1 shows the basic architecture of a printing system 2 suitable for implementing aspects of the exemplary embodiments. The printing system 2 includes a computer/workstation (or PC) 4, which includes various functions, such as an analog waveform generator 6, a digital waveform generator 8, a video frame grabber 10, and motion control 12.

The analog waveform generator 6 generates a low voltage waveform 13 for the nozzles of the multiple piezoelectric print heads 14. A waveform amplifier 16 amplifies the signals received from the analog waveform generator 6. The digital waveform generator 8 generates digital print data for each pixel of the image. The video frame grabber 10 captures the video image and communicates with a camera 18. Motion control 12 moves the substrate and platen (not shown), producing a positional trigger 20.

Figure 2:
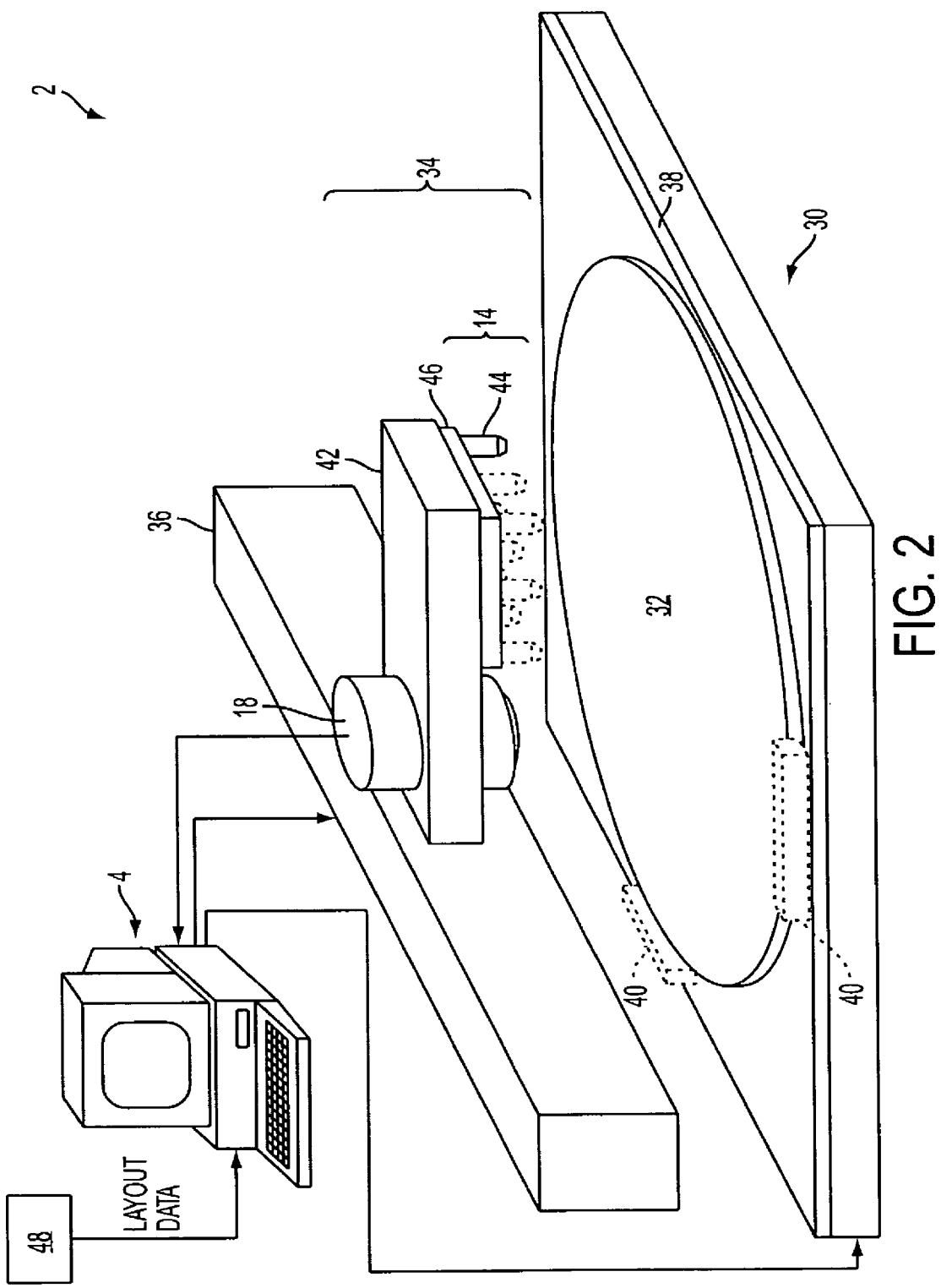
FIG. 2 is a perspective view showing a printing system suitable for implementing aspects of the exemplary embodiment.

FIG. 2 is an alternative illustration of the printing system 2. Note that while the embodiments disclosed herein are described with respect to circuit printing for explanatory purposes, these embodiments can be applied to any situation in which high resolution features, resulting from a printing system, are required. The printing system 2 includes a stand 30 for supporting (and optionally translating) a substrate 32, and a printing assembly 34 mounted to a printing support structure 36. The computer/workstation 4 serves as both a system controller and data processor. The stand 30 includes a rotational platform 38 that allows the orientation of the substrate 32 to be adjusted. Optional alignment features 40 on the rotational platform 38 can be included to provide gross positioning and capture of substrate 32. The printing assembly 34 shows the print head 14 (on a rotational fixture) and the camera 18 (having high magnification capabilities) mounted in a rigid mount 42. It is to be understood there may be multiple print heads 14 independently mounted on the rigid mount 42. Each print head 14 includes one or more ejectors 44 mounted in an ejector base 46. The ejectors 44 are configured to dispense droplets of a printing fluid on the substrate 32. Depending on the type and intended use of the printed pattern being formed, the printing fluid can comprise a variety of materials, including phase-change materials such as wax or photoresist (to form semiconductor process masks), and colloidal suspensions such as solution-processable electronic (i.e., conducting, semiconducting, or dielectric) materials, and organic or inorganic materials (e.g., to form IC features). The substrate 32 can comprise any material on which patterning can be performed, such as a wafer, a glass plate, or even flexible materials such as fabric or plastics. As will be discussed subsequently, the ejectors 44 can be in various arrangements and orientations, according to various embodiments.

The computer/workstation 4 is configured to receive layout data, such as PCB or IC layout data, from a data source 48 and then provide appropriate control signals to the printing support structure 36 and/or the stand 30. The data source 48 can comprise any source of layout data, including a networked computer, a layout database connected via a local area network (LAN) or wide area network (WAN), or even a CD-ROM or other removable storage media. The control signals provided by the computer/workstation 4 control the motion and printing action of the print head 14 as it is translated relative to the substrate 32. Note that the printing action can be provided by the printing support structure 36, by the stand 30, or by both in combination. Note further that the printing action does not have to involve actual movement of the print head itself, as the print head 14 could be held stationary while the stand 30 translates the substrate 32. The computer/workstation 4 is also coupled to receive and process imaging data from the camera 18. The camera 18 can provide both manual and automated calibration capabilities for the printing system 2.

To obtain the desired circuit pattern results from the printing system 2, the PCB or IC layout data must be appropriately processed, the print head 14 must be properly configured, and the print head 14 must be accurately aligned and calibrated with respect to the stand 30.

As noted earlier, print heads with unevenly spaced ejectors are often used in systems to produce high spot placement accuracy by selecting ejectors that do not have significant offset from the desired location, and printing with the reduced set of participating ejectors. To obtain printed resolution which is finer than that of the participating ejectors, multiple printing passes must be used. However, this limits the number of ejectors that qualify for printing and therefore reduces the advantage of having a high density of ejectors in the print head. Furthermore, some of the print heads have offsets in the ejector locations or have ejectors with characteristics which produce drops with trajectories at angles off of normal, which may be deliberately introduced or due to other production limitations. Thus, if some of the ejectors are not in the ideal location but have an offset, the printed spots will have a spot placement accuracy limited by the offset when printed.

Figure 3:
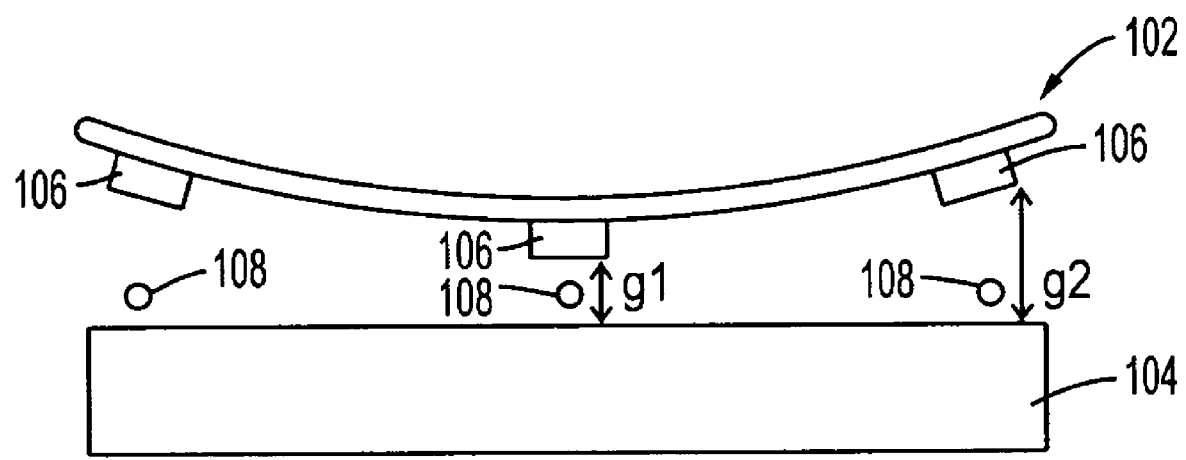
FIG. 3 shows a print head that is not parallel with respect to the substrate.

FIG. 3 shows an example of a print head 102 that is not parallel with respect to a substrate 104. It may be caused by a bow, tilt, etc. in the print head 102. This causes the gaps g1, g2, etc. between the various ejectors 106 and the substrate 104 to be different. These differences in the various gaps g1, g2, etc. will lead to differences in the flight times ($\Delta t$) of the ejected drops 108.

The time of flight is given by t=g/v, where g is the gap and v is velocity of the ejected drop.

Figure 8:
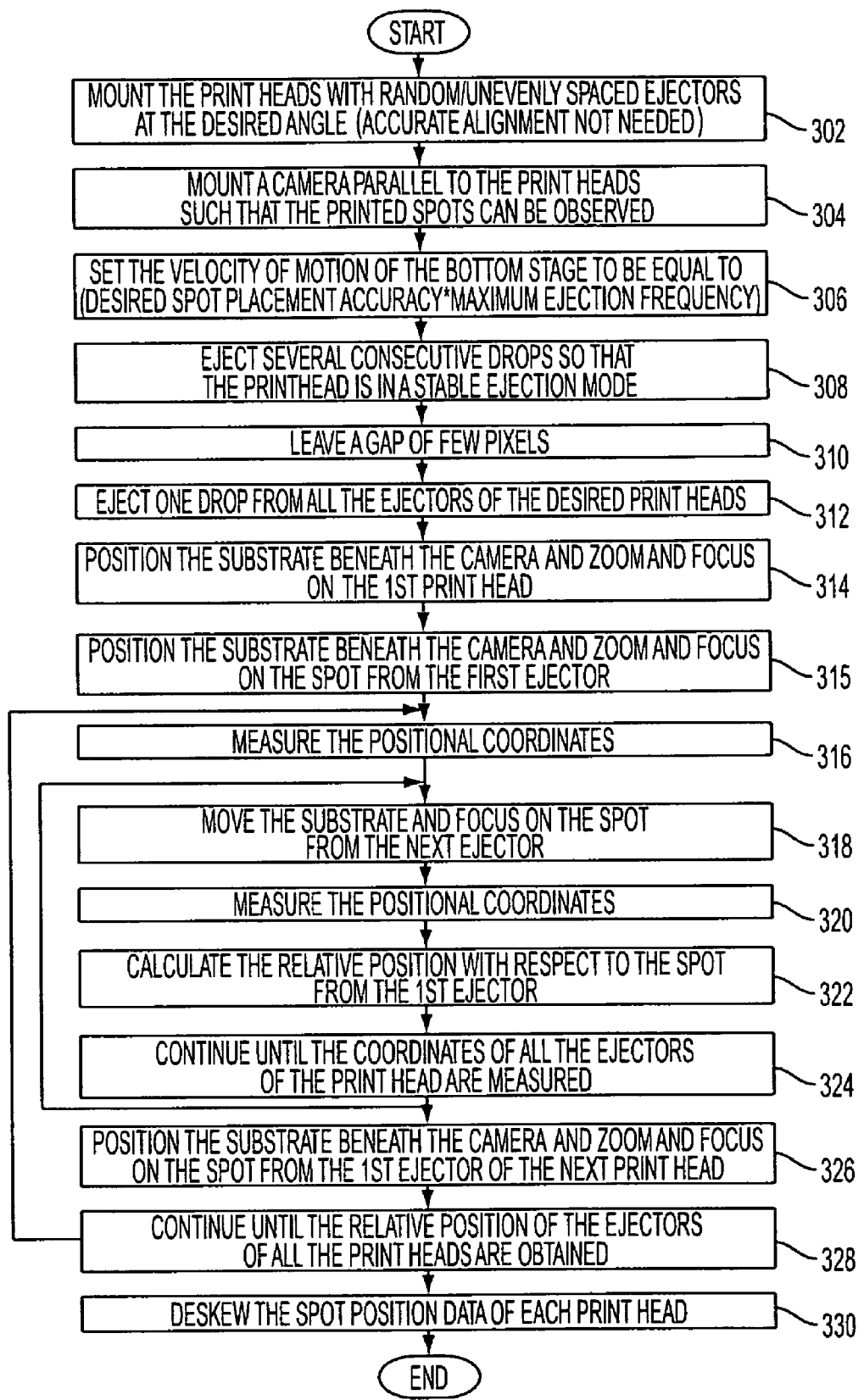
FIG. 8 a flow chart of a method of calibrating the relative spot position of the ejectors with respect to the first spot in accordance with other aspects of the exemplary embodiment.
Figure 9:
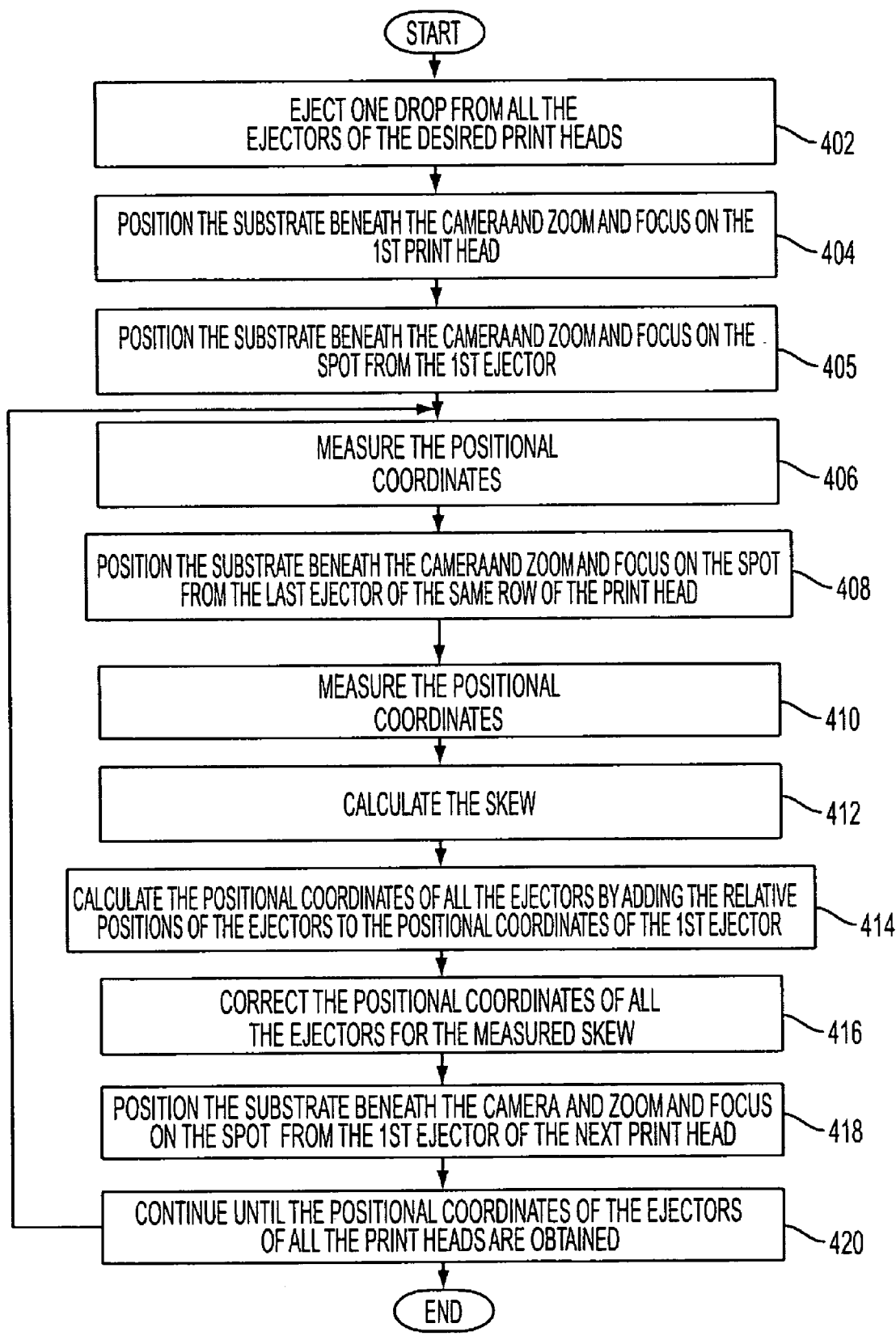
FIG. 9 is a flow chart of a method of measuring the absolute spot positions in accordance with other aspects of the exemplary embodiment.

The time of flight difference ($\Delta t$) translates into a position difference ($\Delta y$) in the printed spot in the process direction. And $\Delta y = (\Delta t)*u$, where u is the velocity with which the substrate moves It is to be understood that $\Delta y$ will be large at high printing speeds, and, if this is not corrected, it will lower the spot placement accuracy. When we use the algorithms given in the flow charts (FIGS. 4, 8 and 9) at the desired print speed to obtain the accurate spot positions, the spot placement inaccuracies due to the bow/tilt can be avoided.

Figure 4:
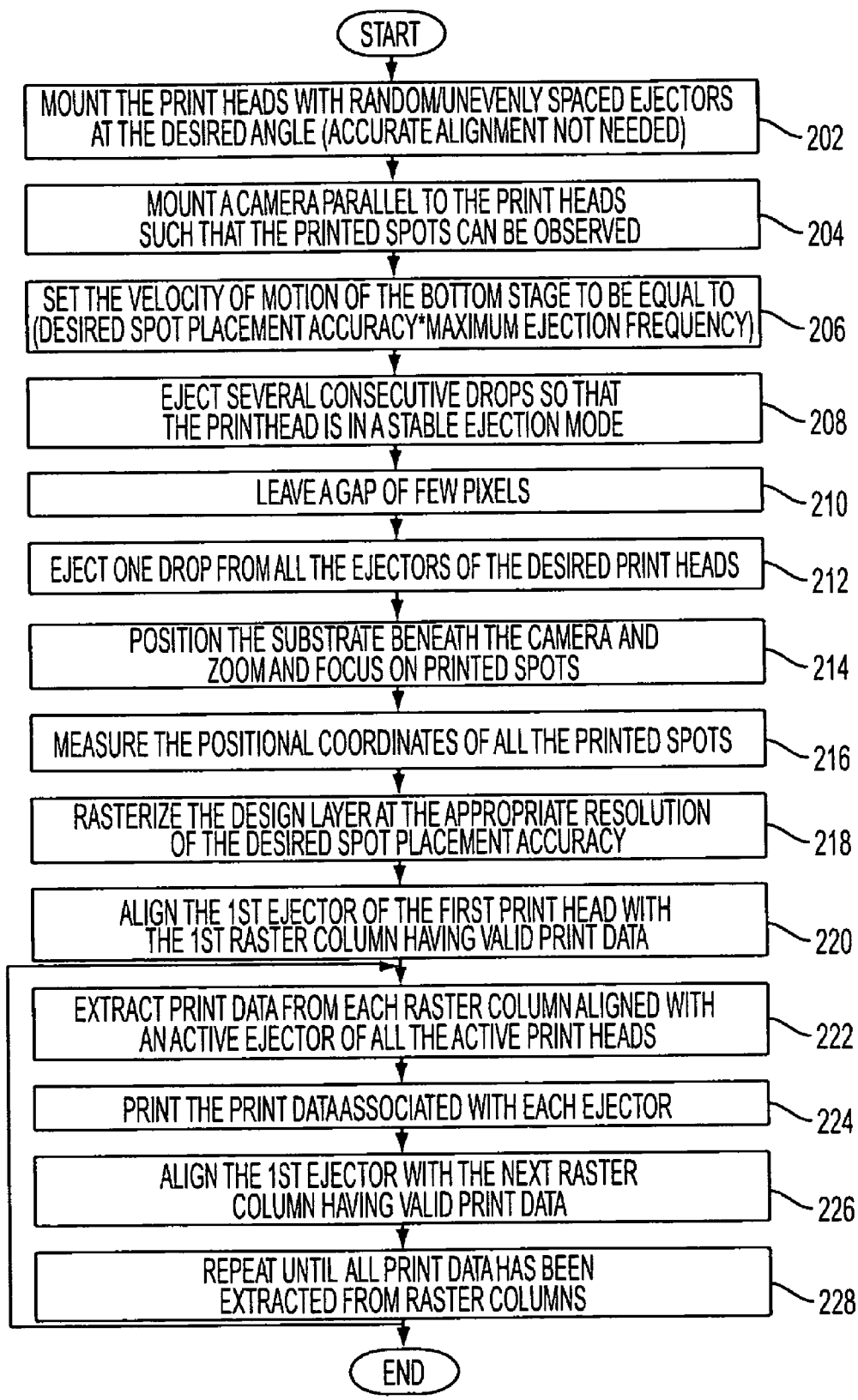
FIG. 4 is a flow chart of the method of printing on a substrate with high spot placement accuracy in accordance with aspects of the exemplary embodiment.
Figure 5:
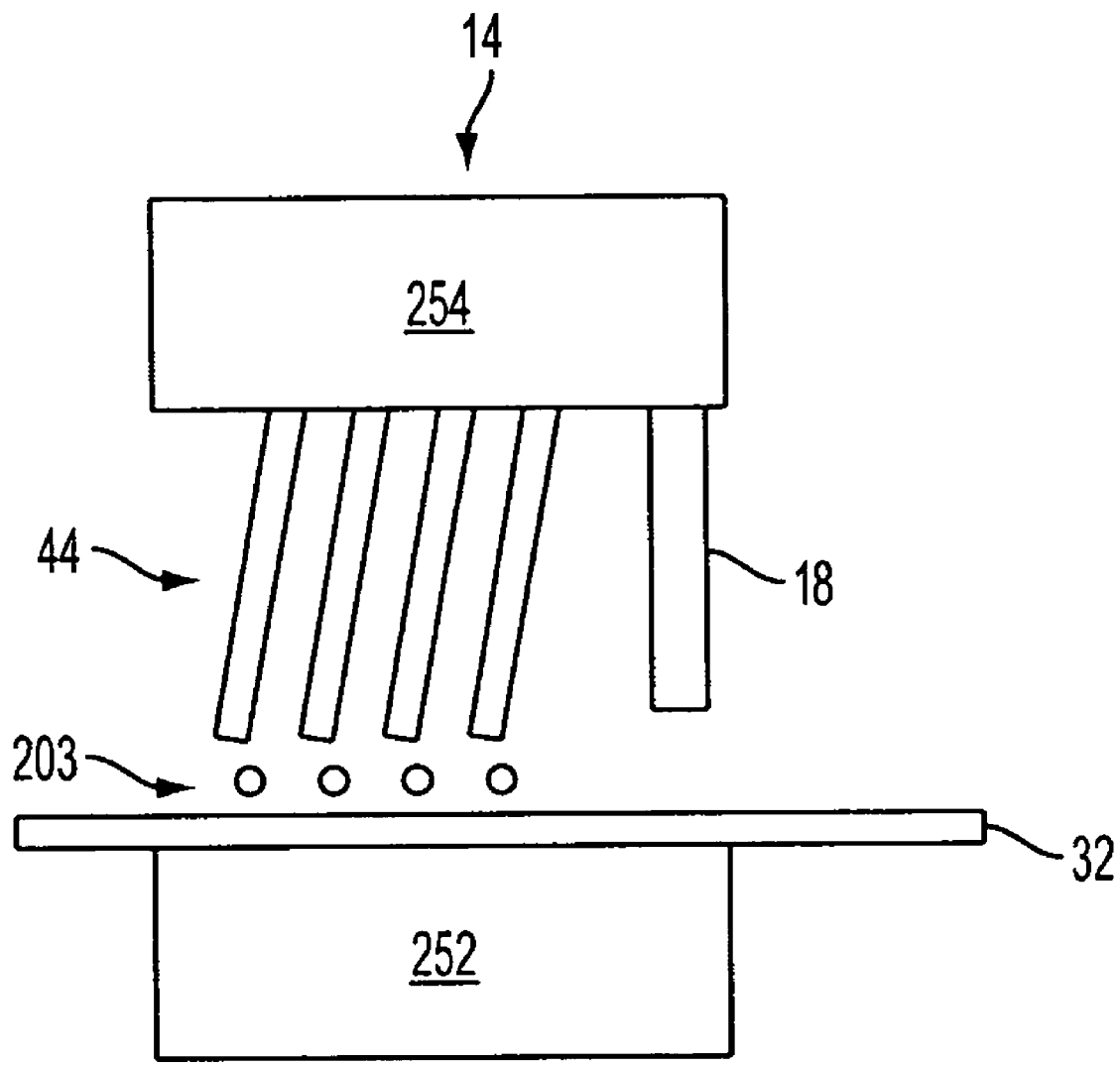
FIG. 5 a side view of drops being ejected from print heads.
Figure 6:
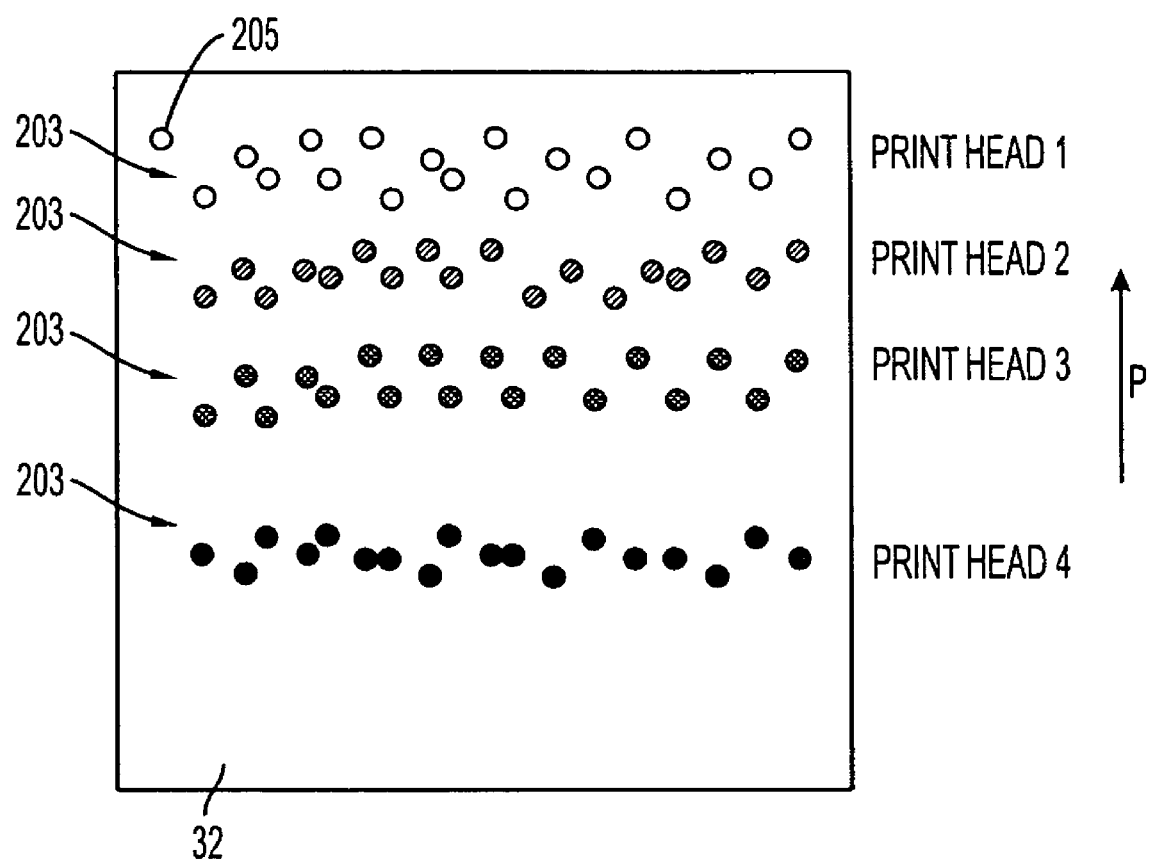
FIG. 6 is a top view of the substrate with printed spots.

In order to avoid these and other problems with print heads, the following method of printing with high spot placement accuracy may be used:

(1) Set up the appropriate equipment (i.e., align the multiple print heads to a reasonable extent, etc.);

(2) Eject drops from all the ejectors of the desired print heads (assuming the print heads have random/unevenly spaced ejector locations);

(3) Use a vision system (e.g., a camera) to measure the position of the resulting spots from the print heads accurately;

(4) Use the inspected spot location data as a new, virtual print head with new ejector positions;

(5) Using the virtual print head description, compute a modified ejector firing recipe; and (6) Print at high addressability and with multiple passes to obtain high spot placement accuracy;

Turning now to FIG. 4, the printing method is described in further detail. In the first phase the equipment is set up. Initially, the multiple print heads 14 with multiple ejectors 44 are mounted in a desired position relative to the substrate 32 and image to be printed (very accurate alignment not needed), as shown in FIG. 5 (a side view of drops being ejected from print heads) (202). The camera 18 is mounted in a mechanically rigid fashion relative to the print heads 14 such that the printed spots 203 from each print head can be observed (204) and their positions can be measured in a reproducible fashion relative to the print head. Turning now to FIG. 6, which is a top view of the substrate 32 with printed spots 203, note that the reference numeral 205 represents the spot from the first ejector of the entire virtual ejector array in the direction orthogonal to the process scanning direction P.

The printing velocity V is set according to the following formula (206):

$$V = S \times E \quad (1)$$

where S is the desired spot placement accuracy and E is the maximum ejection frequency.

Next, several consecutive drops are ejected so that the print heads 14 are in a stable ejection mode (208), leaving a gap of a few pixels (210)

Turning now to the second phase, one to several drops is ejected from all of the ejectors 44 of the desired print heads 14 (212).

Figure 7:
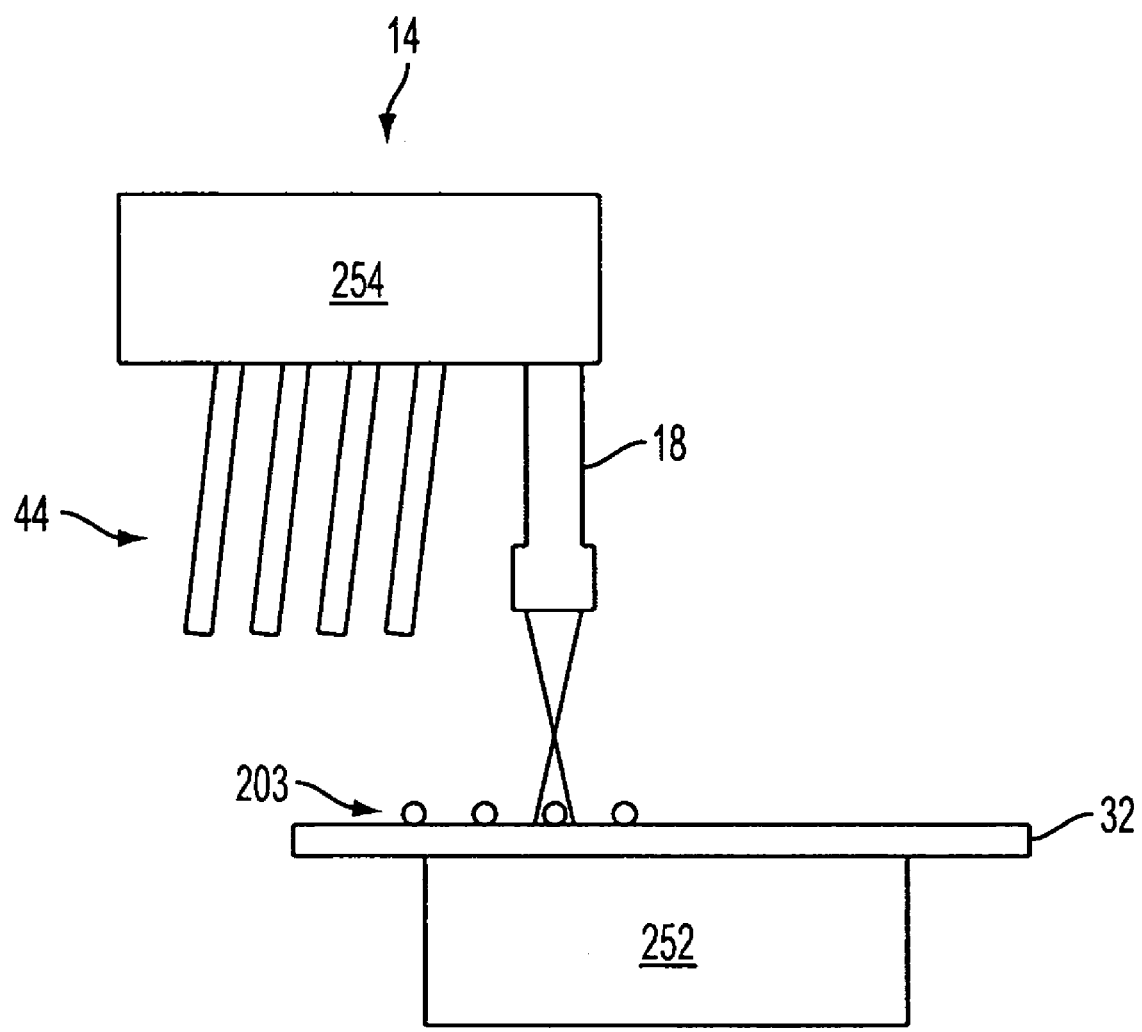
FIG. 7 is a side view of the camera focusing on the printed spots.

The camera 18 is then used to measure the position of the printed spots 203 accurately. As shown in FIG. 7, the substrate 32 is positioned beneath the camera 18, and the camera 18 is zoomed and focused on the printed spots 203 (214). The positional coordinates of all the printed spots 203 are measured (216). The positions are stored. These spot locations serve as a description of a "virtual printhead," which prints reliably accurate to these positions.

The description of the virtual printhead may be improved or modified subsequent to this time. The entire population of ejectors, and their respective spots, may be remeasured and the position data overwritten. The virtual printhead description may be modified or calibrated at a later time using a similar approach.

A subset of ejectors (one or many) may print spots which may be inspected. The position of these spots may be compared with the expected position as predicted by the initial virtual printhead description. The differences will describe a translation and/or rotation that may be applied to all virtual printhead positions by either (A) moving the physical printheads or (B) modifying the virtual position data. By inspecting only a subset of ejectors and defining a correction, the entire virtual position data may be modified quickly. It should be noted that differences in these positions may be called deltas, errors, displacements, shifts, drifts, calibrations, or other names commonly used in the marking industry.

The accuracy with which the spots are printed may be assessed by inspecting a printed image. Errors in spot position will show up in a printed image. If the resulting printed image is compared with the anticipated image, errors may be identified. Images which reveal spot position errors are used in the marking industry. For example, slanted, continuous lines printed with errant spots may appear with jagged, saw tooth appearance. It is possible to identify which ejectors caused the errant spots. And it is possible to measure the error in that spot placement. With this error information, the description of the virtual printhead positions may be improved or updated by (A) changing each spot position individually or (B) determining a general translation and/or rotation to apply to the population of virtual positions or physical ejectors.

The virtual print head is not just the as measured positions but the measured positions recalculated such that given the updated measured position of 2 or more ejector spots in "printed space," all the spot positions can be determined within reproducible accuracy.

A method for "virtualizing" the print head and associating it with a specific but common coordinate system is (1) defining ejector #1 as the origin, thus subtracting ejector No. 1's X,Y coordinates from the measured spots from that print head, and (2) after performing a linear fit to the spot positions, subtract off the slope. In this way, the virtual spot positions are defined relative to themselves only. It is thus possible for the print head to be taken out of the printer and reinstalled at a later time with the virtual print head positions still valid (given the same printing speed and vertical relation to the target substrate surface).

Next, an image is desired to be printed. Based on the desired printing resolution, spot placement accuracy, the image file, and the virtual printhead, calculations construct the printing recipe of firing times, locations, and number of passes. The design layer is rasterized at the appropriate resolution for the desired spot placement accuracy S (218). An ejector of one of the print heads is aligned with the first raster column having a valid print data (220). A first pass is made with that ejector creating features in that first raster column. During the same pass, other ejectors, with virtual spot positions which pass over columns where printing is required, may eject droplets. If more columns of printing are required, the printheads are shifted in location, and another pass is made. Very high resolution, in the direction normal to the scanning direction, may be realized when very many passes are made, thus increasing the number of printable columns per given distance normal to the process direction. In the process direction, very high resolution may be realized by increasing the allowable ejection events per a given distance in the process direction.

In the final phase, it is desirable to print at high addressability and with multiple passes to obtain high spot placement accuracy. This involves extracting print data from each raster column aligned with an each ejector for all of the active print heads (222). The ejector, raster column and raster row are selected for each ejection event by using the spot placement data, not the ejector positions. The data associated with each ejector is printed (224). The first ejector of the entire virtual ejector array in the direction orthogonal to the process scanning direction is aligned with the next raster column having valid print data (226). In other words, it is the most external ejector on one edge of the array (see FIG. 6). Any virtual ejector that will pass over another raster column during this pass may be scheduled to participate. Steps 222, 224, and 226 are repeated until all print data has been extracted from the raster columns (228).

Thus, a printing sequence may be calculated to be used to make a desired image based on the virtual print head descriptions. The image may then be printed with the calculated printing sequence utilizing the virtual print head description(s). According to this method, printing at 4800 DPI will give a spot placement error of 5.3 microns with the possible addition of any droplet ejection angle variability for a given ejector.

Measuring the position of the printed spots will compensate for all reproducible issues like thermally induced changes in ejector position, variability in ejector to ejector drop velocity variations, etc. It is desirable to have alignment between the print heads to the best possible extent and to minimize the offsets from the ideal location so that the number of passes may be limited. It should also be understood that, particularly during calibration, stable substrates should be used to avoid distortion of the measurements. Also the environment, such as temperature, should be controlled to minimize influences.

This above-mentioned calibration procedure may be performed as frequently as required with a fast vision system.

Thus, the system includes motion control and vision to accurately determine the printed spot position. It is possible to get good spot placement accuracy of the spots using a print head with unevenly spaced ejectors, if the system has a vision system to look for the spot positions and uses this information to print at high addressability.

Alternatively, if the print head ejectors produce spots whose positions are very reproducible over time (within the required tolerance), it may be possible to (A) calibrate the relative spot position of the ejectors with respect to each other and (B) recalculate the absolute spot positions based on the spot position of a subset of measured spot positions. Step (A) can be done only once or rarely whereas Step (B) can be performed as often as necessary.

The calibration step (A) for a single head has been outlined in detail previously and in FIG. 4. An extension of calibration step (A) for multiple print heads is outlined in greater detail in the flow chart shown in FIG. 8. Initially, the print heads 14 are mounted with random/unevenly spaced ejectors at the desired angle (accurate alignment not needed) (302). The camera 18 is mounted in a mechanically rigid fashion relative to the print heads 14 such that the printed spots from each print head can be observed (304) and their positions can be measured in a reproducible fashion relative to the print head. The velocity V of the bottom stage 252 is set according to Eq. (1), while the top stage 254 remains stationary (see FIGS. 5 and 7).

Next, several consecutive drops are ejected so that the print heads 14 are in a stable ejection mode (308), leaving a gap of a few pixels (310).

One to several drops are then ejected from all of the ejectors 44 of the desired print heads 14 (312).

The camera 18 is then used to measure the position of the printed spots 203 from the print heads 14 accurately. Thus, the substrate 32 is positioned beneath the camera 18, which is zoomed and focused on the first print head (314). Then, the substrate 32 is positioned beneath the camera 18, which is zoomed and focused on the spot from the first ejector (315). The positional coordinates are then measured (316). Note that zooming the camera 18 may lead to errors due to the axis of the camera not being perfectly perpendicular with the surface of the substrate 32. To avoid such errors, it may be helpful to use the camera 18 at one zoom power for every spot measurement. So, the camera 18 may be zoomed in and out, but the zoom value should be the same during each spot measurement.

The next step is to move the substrate 104 and focus the camera 118 on the printed spot from the next ejector (318). The positional coordinates of the printed spot from the next ejector are measured (320). Next, the relative position with respect to the printed spot from the first ejector is calculated (322). These last three steps are continued until the coordinates of all the ejectors of the print head are measured (324).

Once again, the substrate 104 is positioned beneath the camera 118, which is zoomed and focused on the printed spot from the first ejector of the next print head (326). Continue until the relative positions of the ejectors 44 of all the print heads 14 are obtained (328).

Finally, the printed spot position data for each print head 14 is deskewed (330). The deskewing operation may be accomplished by subtracting off the slope calculated from a linear fit to the positional data of all the ejector spots or a subset of ejector spots taken to be characteristic of the print head alignment. The positions are then made relative to each other by subtracting off the position of the first ejector. Skewing and deskewing of the print heads may be performed by using polar coordinates. The skew of the print head 14 may be determined by theta=arctan (v/u) where (0,0) are the coordinates of the first ejector and (u,v) are the coordinates of the last ejector in the same row. The coordinates of the points after the rotation may be expressed as $u'=r\cos(\Theta)$ and $v'=r\sin(\Theta)$, where $r=\sqrt{(u^2+v^2)}$ and $\Theta$ is the angle of rotation The measurement step (B) is outlined in greater detail in the flow chart shown in FIG. 9. Initially, one drop is ejected from a subset of the ejectors 44 of the desired print heads 14 (402). In one embodiment, the subset may consist of the first and the last ejector from each print head. The camera 18 is then used to measure the position of the printed spots from the print heads accurately. Thus, the substrate 104 is positioned beneath the camera 118, and the camera 118 is zoomed and focused on the first print head (404). Next, the substrate 32 is positioned beneath the camera 18, which is zoomed and focused on the spot from the first ejector (405). The positional coordinates of the spot from the first ejector of the first print head are measured (406). The substrate 32 is then positioned beneath the camera 18, which is focused on the spot from the last ejector of the same row of the print head (408).

In the next few steps, the position and skew factors, which represent the current overall position and alignment of each print head, are calculated (410, 412, 414) and applied to the deskewed relative positions of all the ejector spots (416) obtained in step (A) to obtain an accurate absolute determination of the ejector spot positions for printing with the print head. The substrate 104 is then positioned beneath the camera 118 and zoomed and focused on the spot from the first ejector of the next print head (418). This process (B) is performed for all the print heads in the printer (420).

Figure 10:
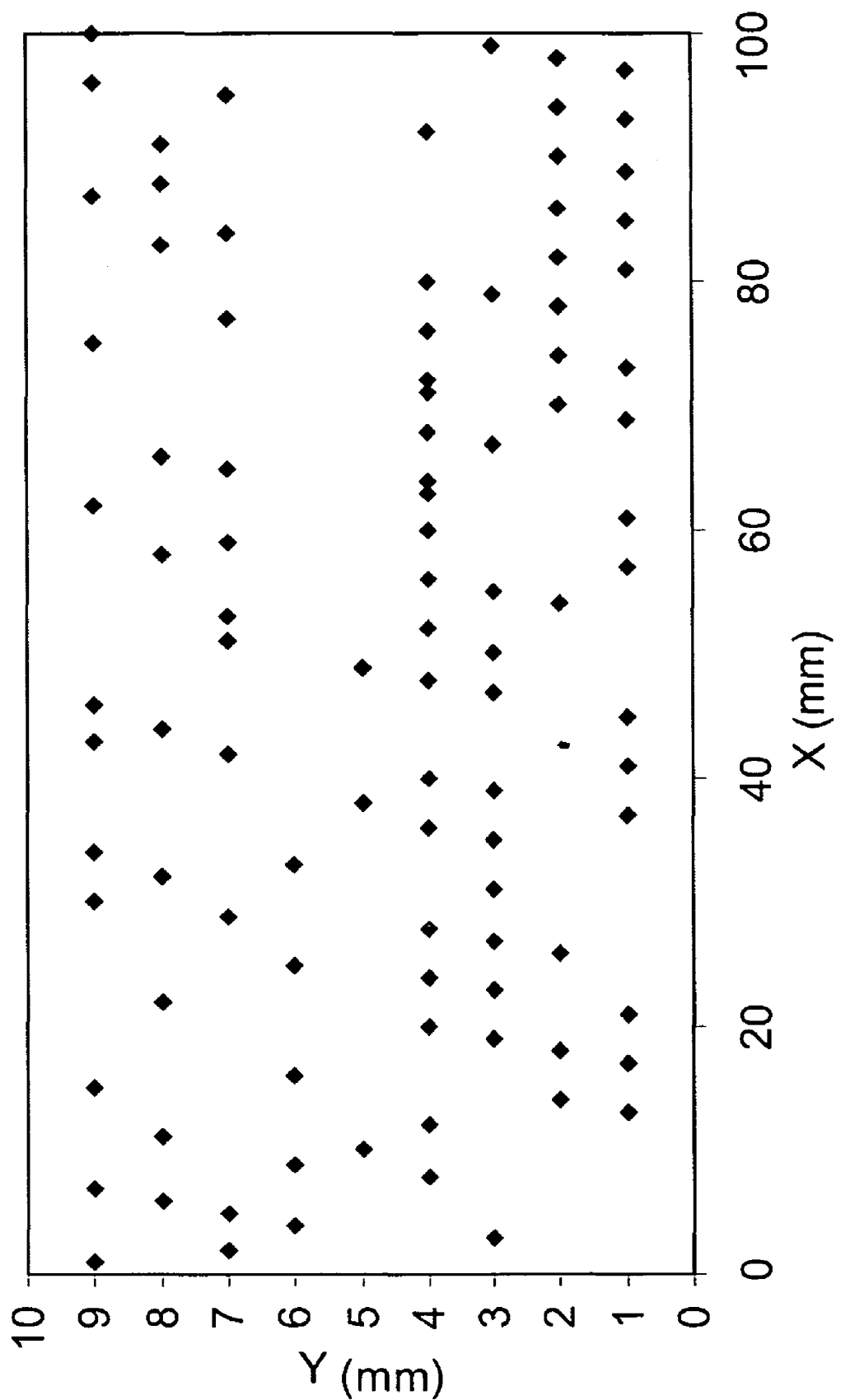
FIG. 10 is a graph showing the coordinates of a print head with arbitrary ejector locations.
Figure 11:
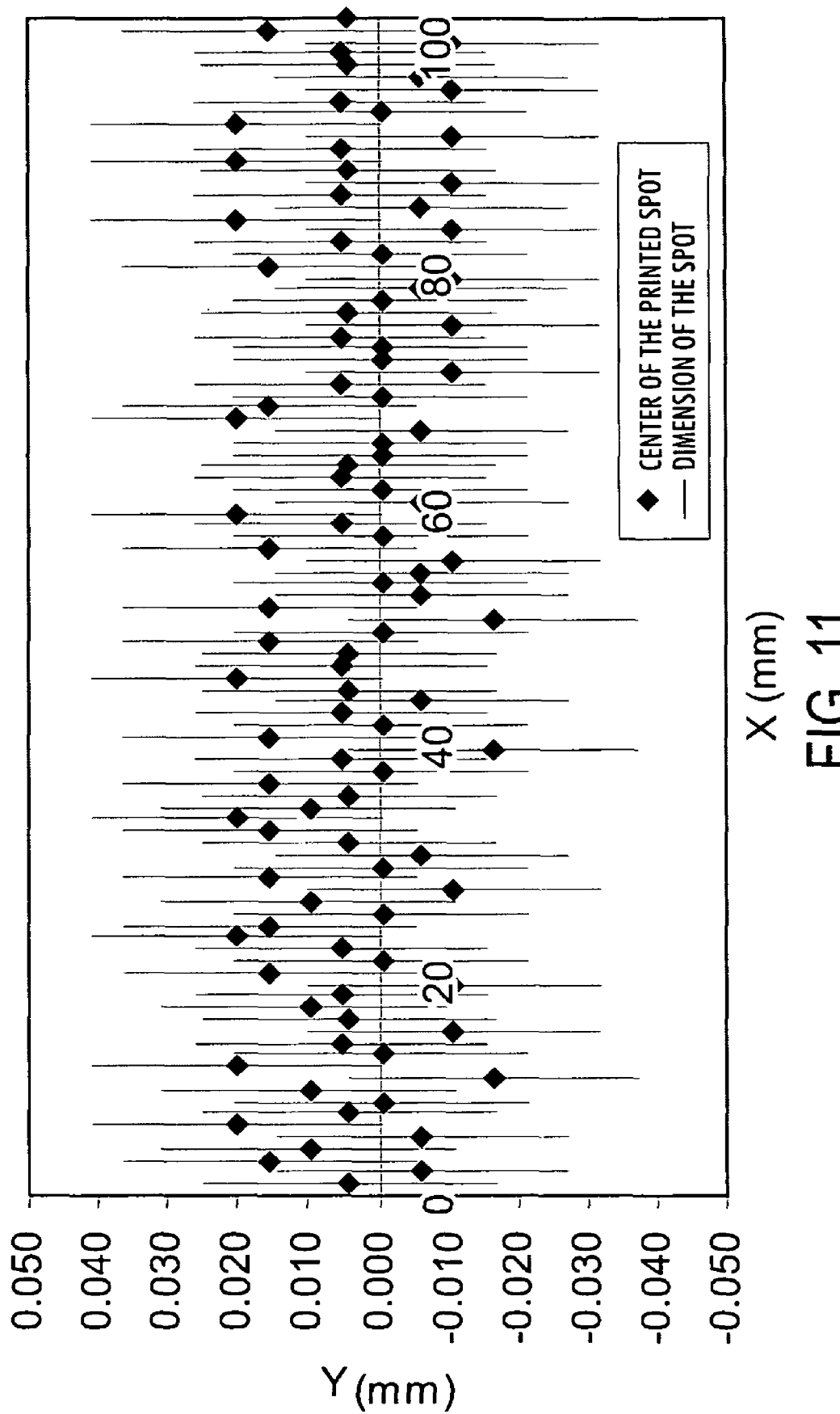
FIG. 11 is a graph showing a line printed across the process direction using the print head with arbitrary ejector locations at 600 DPI.
Figure 12:
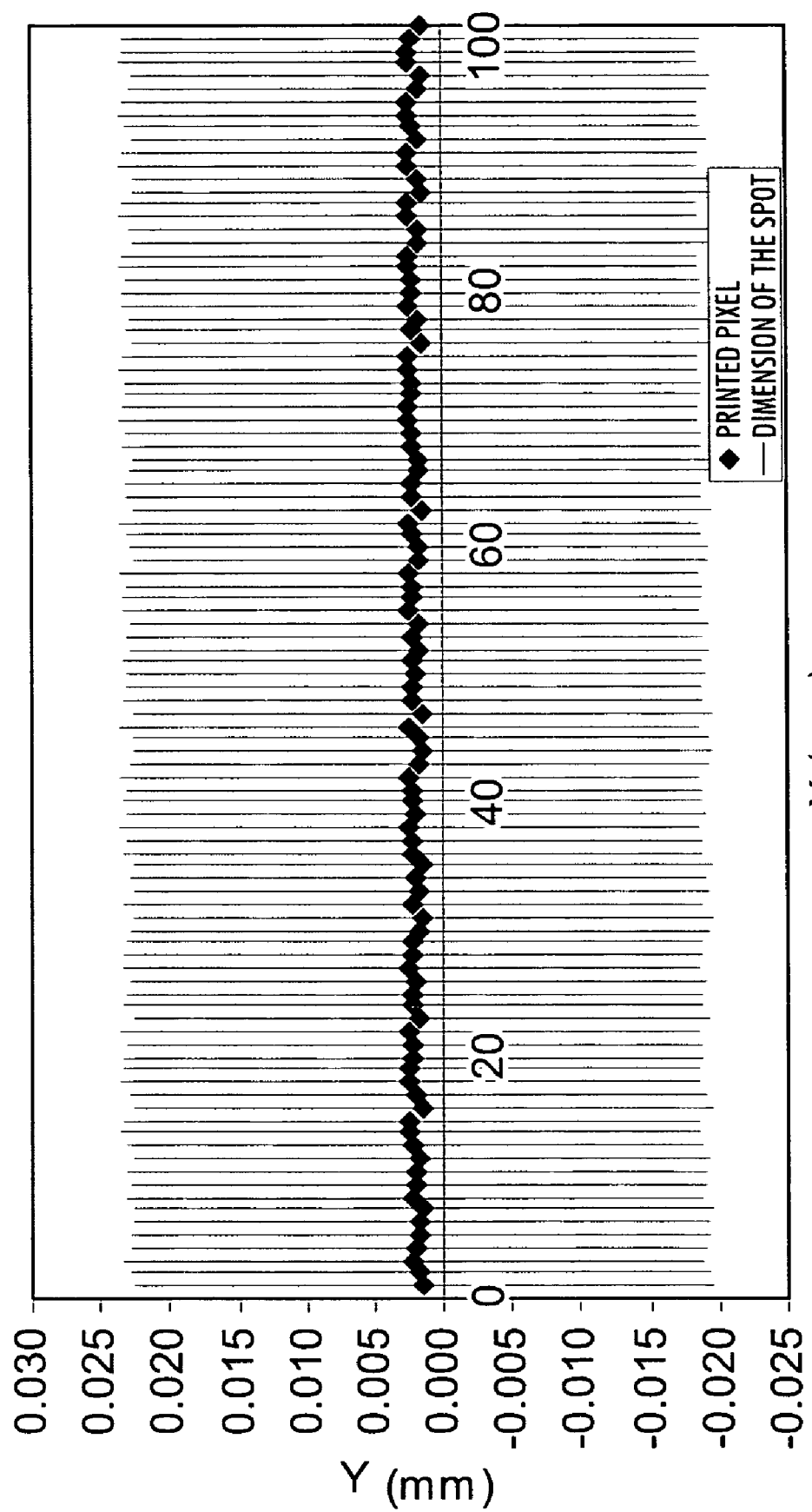
FIG. 12 is a graph showing a line printed across the process direction using the print head with arbitrary ejector locations at 4800 DPI.

FIGS. 10-12 show how a print head with an arbitrary ejector layout can produce high spot placement accuracy at high addressability. FIG. 10 shows the coordinates of a print head with arbitrary ejector locations. FIG. 11 illustrates an example of a line printed across the process direction using the print head with arbitrary ejector locations at 600 DPI showing scatter up to 42.33 µm. FIG. 12 illustrates an example of a line printed across the process direction using the print head with arbitrary ejector locations at 4800 DPI showing scatter up to 5.29 µm.

The exemplary embodiment proposes an easy method to print spots with high spot placement accuracy by compensating for the inaccuracies in the ejector's spot position and misalignment of the multiple print heads with each other.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

The invention claimed is:

1. A method of virtualizing a print head for use in printing spots on a substrate, the method comprising:
    setting up a plurality of components of a printing system having a process direction, where the plurality of components includes a camera and one or more print heads with one or more ejectors on each print head;
    ejecting at least one drop from all of the ejectors of at least one print head to produce spots on a media;
    using the camera to measure the positions of the printed spots from the print head relative to a set of known ejector positions which produced the printed spots;
    defining a first ejector of the print head as the origin of a print head coordinate system, wherein all other ejectors on the print head are located at a fixed X and Y position relative to the first ejector in the print head coordinate system;
    performing a linear fit to the printed spot positions, wherein the linear fit is used to obtain a slope of the printed spots relative to the printer process direction;
    defining the position of the first ejector as the origin in the print head coordinate system and the position of the spot produced by the first ejector as the origin in a printed media coordinate system, wherein the obtained slope is subtracted from the measured spot positions which translates the spot positions to the print head coordinate system; and
    storing the resulting spot positions in the print head coordinate system as initial virtual positions describing at least one virtual print head.

2. The method of claim 1, further comprising:
    installing a print head into the printing system;
    printing a subset of spots with the print head;
    inspecting and measuring the subset of spots to find a virtual print head coordinate system that was previously defined for that print head; and
    relating the virtual print head coordinate system and the spot positions in it to a virtual printing system.

3. The method of claim 1, further comprising:
    calculating a printing sequence to be used to make a desired image based on the virtual print head descriptions.

4. The method of claim 3, further comprising:
    printing an image with the calculated printing sequence utilizing the virtual print head descriptions.

5. The method of claim 1, further comprising:
    printing one spot from an ejector on a print head;
    inspecting the spot;
    determining the difference of the position of the spot from the initial virtual position anticipated; and
    updating the virtual positions for the print head by that difference.

6. The method of claim 5, further comprising:
    calculating a printing sequence to be used to make a desired image based on the updated virtual print head descriptions; and
    printing an image with the calculated printing sequence utilizing the updated virtual print head descriptions.

7. The method of claim 1, further comprising:
    printing a plurality of spots from a subset of the ejectors on a print head;
    inspecting the spots;
    determining the rotation and translation differences from the initial virtual positions for the print head; and
    updating the virtual positions for the print head.

8. The method of claim 7, further comprising:
    calculating a printing sequence to be used to make a desired image based on the updated virtual print head descriptions; and
    printing an image with the calculated printing sequence utilizing the updated virtual print head description.

9. The method of claim 1, further comprising:
    rotating or translating one or more of the print heads by a predetermined amount and updating the virtual print head descriptions by the predetermined values.

10. The method of claim 9, further comprising:
calculating a printing sequence to be used to make a desired image based on the updated virtual print head descriptions; and
printing an image with the calculated printing sequence utilizing the updated virtual print head description.

11. The method of claim 1, further comprising:
using multiple passes of the printing system to provide for high resolution spot placement orthogonal to the process direction of the printing system.

12. The method of claim 1, further comprising:
calculating a printing sequence to be used to make a desired image based on the virtual print head descriptions;
printing an image with the calculated printing sequence utilizing the virtual print head descriptions;
using the resulting printed image inspection data to determine an error; and
translating or rotating the print heads by the determined error.

13. The method of claim 1, further comprising:
calculating a printing sequence to be used to make a desired image based on the virtual print head descriptions;
printing an image with the calculated printing sequence utilizing the virtual print head descriptions;
using the resulting printed image inspection data to determine an error; and
updating the virtual print head descriptions by the determined error.

14. The method of claim 1, further comprising:
maintaining the same print conditions when measuring and updating the virtual positions and during the operation of the final printing process.

15. The method of claim 1, wherein the print head is able to be removed and reinstalled at a later time with the virtual positions still being valid.

16. A storage medium storing a set of program instructions executable on a data processing device and usable to virtualize a print head for use in printing spots on a substrate, the set of program instructions comprising:
instructions for setting up a plurality of components of a printing system, where the plurality of components includes a camera and one or print heads with one or more ejectors on each print head;
instructions for ejecting at least one drop from at least one print head to produce spots on a media;
instructions for using the camera to measure the positions of the printed spots from the print head related to a set of known ejector positions which produced the printed spots;
instructions for defining a first ejector of the print head as the origin of a print head coordinate system, wherein all other ejectors on the print head are located at a fixed X and Y position relative to the first ejector in the print head coordinate system;
instructions for performing a linear fit to the printed spot positions, wherein the linear fit is used to obtain a slope of the printed spots relative to a printer process direction;
instruction for defining the position of the first ejector as an origin in the print head coordinate system and the position of the spot produced by the first ejector as an origin in a printed media coordinate system, wherein the obtained slope is subtracted from the measured spot positions which translated the spot positions to the print head coordinate system; and
instructions for storing the measured spot positions in the print head coordinate system as initial virtual positions describing at least one virtual print head.

17. The storage medium of claim 16, wherein the set of program instructions further comprises:
instructions for calculating a printing sequence to be used to make a desired image based on the virtual print head descriptions.

18. The storage medium of claim 17, wherein the set of program instructions further comprises:
instructions for printing an image with the calculated printing sequence utilizing the virtual print head descriptions.

19. The storage medium of claim 16, wherein the set of program instructions further comprises:
instructions for printing one spot from an ejector on a print head;
instructions for inspecting the spot;
instructions for determining the difference of the position of the spot from the initial virtual positions anticipated;
instructions for updating the virtual positions by that difference;
instructions for calculating a printing sequence to be used to make a desired image based on the updated virtual print head descriptions; and
instructions for printing an image with the calculated printing sequence utilizing the updated virtual print head descriptions.

20. The storage medium of claim 16, wherein the set of program instructions further comprises:
instructions for printing a plurality of spots from a subset of the ejectors on a print head;
instructions for inspecting the spots;
instructions for determining the rotation and translation differences from the initial virtual positions for the print head; and
instructions for updating the virtual positions for the print head;
instructions for calculating a printing sequence to be used to make a desired image based on the updated virtual print head descriptions; and
instructions for printing an image with the calculated printing sequence utilizing the updated virtual print head descriptions.

21. The storage medium of claim 16, wherein the set of program instructions further comprises:
instructions for rotating or translating one or more of the print heads by a predetermined amount and updating the virtual print head descriptions by the predetermined values;
instructions for calculating a printing sequence to be used to make a desired image based on the updated virtual print head descriptions; and
instructions for printing an image with the calculated printing sequence utilizing the updated virtual print head descriptions.

22. The storage medium of claim 16, wherein the set of program instructions further comprises:
instructions for using multiple passes of the printing system to provide for high resolution spot placement orthogonal to the process direction of the printing system.

23. The storage medium of claim 16, wherein the set of program instructions further comprises:
instructions for calculating a printing sequence to be used to make a desired image based on the virtual print head descriptions;
instructions for printing an image with a calculated printing sequence utilizing the virtual print head description;

instructions for using the resulting printed image inspection data to determine an error; and instructions for translating and rotating the print heads by the determined error.

24. The storage medium of claim 16, wherein the set of program instructions further comprises:

instructions for calculating a printing sequence to be used to make a desired image based on the virtual print head descriptions;

instructions for printing an image with a calculated printing sequence utilizing the virtual print head description;

instructions for using the resulting printed image inspection data to determine an error;

instructions for modifying the virtual print head descriptions by the determined error;

instructions for calculating a printing sequence to be used to make a desired image based on the virtual print head descriptions; and instructions for printing an image with the calculated printing sequence utilizing the virtual print head descriptions.

25. The storage medium of claim 16, wherein the set of program instructions further comprises:

instructions for maintaining the same print conditions when measuring and updating the virtual positions and during the operation of the final printing process.

* * * * *